US012751110B2

(12) United States Patent
Chang et al.

(10) Patent No.: US 12,751,110 B2
(45) Date of Patent: Sep. 29, 2026

(54) SUBSTRATE WITH LOW-REFLECTION SURFACE FILM AND STRUCTURE, AND SEMICONDUCTOR DEVICE

(71) Applicant: National Chung Cheng University, Minhsiung (TW)

(72) Inventors: Guo-En Chang, Minhsiung (TW); Po-Ruei Huang, Minhsiung (TW)

(73) Assignee: National Chung Cheng University, Minhsiung (TW)

( * ) Notice: Subject to any disclaimer, the term of this patent is extended or adjusted under 35 U.S.C. 154(b) by 657 days.

(21) Appl. No.: 18/154,313

(22) Filed: Jan. 13, 2023

(65) Prior Publication Data

US 2024/0128383 A1 Apr. 18, 2024

(30) Foreign Application Priority Data

Oct. 18, 2022 (TW) ................................ 111139374

(51) Int. Cl.
*H10F 77/30* (2025.01)
*H10H 20/84* (2025.01)

(52) U.S. Cl.
CPC .......... *H10F 77/315* (2025.01); *H10H 20/84* (2025.01)

(58) Field of Classification Search
CPC ....... H10H 20/82; H10H 20/84; H10F 77/315
See application file for complete search history.

(56) References Cited

U.S. PATENT DOCUMENTS

2020/0098956 A1* 3/2020 Hendrickson ........ H10H 20/826

FOREIGN PATENT DOCUMENTS

| | | | | |
|---|---|---|---|---|
| CN | 115274894 A | * 11/2022 | ............ | H10F 71/00 |
| TW | I377687 B | 11/2012 | | |
| TW | I389327 B | 3/2013 | | |

OTHER PUBLICATIONS

Improved Machine Translation of CN-115274894-A, 2022.*

* cited by examiner

*Primary Examiner* — Suberr L Chi
(74) *Attorney, Agent, or Firm* — MUNCY, GEISSLER, OLDS & LOWE, P.C.

(57) ABSTRACT

A substrate with a low-reflection surface film and structure is provided. A germanium-tin (GeSn) layer or a silicon-germanium-tin (SiGeSn) layer is arranged on an upper surface of a semiconductor substrate as a low-reflection film. A thickness of the low-reflection film is in a range of 10 nm to 10 μm, and an upper surface of the low-reflection film is a rough surface. An electronic element formed on the substrate with a low-reflection surface film and structure has a higher absorption for a light source of the same intensity, the response of a photodetector can be improved, and the photoluminescence (PL) intensity can be enhanced.

3 Claims, 4 Drawing Sheets

SUBSTRATE WITH LOW-REFLECTION SURFACE FILM AND STRUCTURE, AND SEMICONDUCTOR DEVICE

CROSS-REFERENCE TO RELATED APPLICATION

This application claims the benefit of Taiwan Patent Application No. 111139374, filed on 18 Oct. 2022, which is hereby incorporated by reference for all purposes as if fully set forth herein.

BACKGROUND

Technical Field

The invention relates to a semiconductor substrate, and in particular, to a substrate with a low-reflection surface film and structure, and a semiconductor device using the substrate.

Related Art

A natural optical system, for example, eyes of various animals, can visualize various colors. Nature can provide inspiration for scientists trying to design better optical systems, thus promoting the development of bionic systems. A bionic anti-reflection system is an example of this method. A surface of eyes of a moth has a unique sub-wavelength structure, so as to significantly reduce light reflection, help the moth improve light collection in the dark, and avoid a predator in the light. Various optical elements are designed in a similar manner to enhance the anti-reflection performance. The light (an electromagnetic wave) will be partially reflected due to refractive index (RI) mismatch when entering different media. In various optical and photoelectric elements, including a semiconductor light-emitting element (display), a solar cell, and a semiconductor photodetection element, the reflection at the interface greatly affects the performance. In order to minimize unnecessary reflection and improve light collection efficiency, different types of anti-reflection surfaces have been studied.

The light collection efficiency is an important factor affecting the performance of many optical and photoelectric elements. In these devices, the high reflectivity of the interface may hinder the effective light collection. In order to minimize unwanted reflection, the anti-reflection surface may be made by micro/nano patterns. For example, if the back reflection layer in a thin film solar cell forms a crumpled structure on the surface, by making various kinds of crumpled structures on the surface of the back reflection layer, the surface roughness of the reflected layer can be increased, thereby enhancing the light scattering intensity.

For example, according to a solar cell structure of a polycrystalline silicon germanium film combined with a monocrystalline silicon substrate and a manufacturing method therefor described in the Taiwan Patent No. 1377687, a rough surface structure is provided. For example, according to a solar cell structure of an amorphous silicon germanium film combined with a monocrystalline silicon substrate and a manufacturing method therefor described in the Taiwan Patent No. 1389327, a rough surface structure is provided.

Further, a broadband anti-reflection silicon surface is manufactured by laser micro/nano processing. Laser direct writing is used for creating a microstructure on the silicon surface, and light reflection is reduced by light trapping. In addition, a silicon nanowire array is manufactured by laser interference photolithography and metal-assisted chemical etching. The high aspect ratio sub-wavelength structure greatly improves the anti-reflection performance, so that the refractive index gradient from the ambient air to the substrate is generated, thereby achieving low reflectivity. By making the material surface rough, the reflectivity of the material surface can be reduced. The material with the reduced reflectivity has a higher absorption for a light source of the same intensity, the response of a photodetector can be improved, and the photoluminescence (PL) intensity can also be enhanced.

However, the light absorption of silicon (Si) the light absorption of silicon (Si) occurs to the wavelength below 1100 nm corresponding to a band gap of single crystal Si. However, wavelength between 300 nm and 1200 nm, the light collection efficiency of the silicon (Si) surface is not high enough for many applications due to the relatively high reflectivity at the air/silicon (Si) interface caused by the high refractive index (RI) of silicon (Si). In the related art, roughing is performed on the surface of silicon (Si), the surface of the germanium (Ge) film, or the surface of the silicon germanium (SiGe) film. The roughing may reduce the reflectivity of the material surface, but finds application only in the case of near infrared rays.

SUMMARY

The purpose of the present invention is to provide a substrate with a low-reflection surface film and structure. By causing the substrate surface film material to become rougher, the reflectivity of the material surface can be reduced. The reflectivity is reduced, so that an electronic element formed on the substrate with a low-reflection surface film and structure has a higher absorption for a light source of the same intensity, the response of a photodetector can be improved, and the PL intensity can also be enhanced.

In order to achieve the above objective, the present invention provides a substrate with a low-reflection surface film and structure, including a semiconductor substrate; and a germanium-tin (GeSn) layer, arranged on an upper surface of the semiconductor substrate as a low-reflection film, where a thickness of the germanium-tin (GeSn) layer is in a range of 10 nm to 10 μm, and an upper surface of the germanium-tin (GeSn) layer is a rough surface.

A material content of the germanium-tin (GeSn) layer is germanium (Ge) in a range of 60 at % to 99.9 at % and tin (Sn) in a range of 0.1 at % to 40 at %. A surface roughness (Ra) of the upper surface of the germanium-tin (GeSn) layer is in a range of 0.01 μm to 3 μm.

The present invention provides a substrate with a low-reflection surface film and structure, including a semiconductor substrate; and a silicon-germanium-tin (SiGeSn) layer, arranged on an upper surface of the semiconductor substrate as a low-reflection film, where a thickness of the silicon-germanium-tin (SiGeSn) layer is in a range of 10 nm to 10 μm, and an upper surface of the silicon-germanium-tin (SiGeSn) layer is a rough surface.

A material content of the silicon-germanium-tin (SiGeSn) layer is silicon (Si) in a range of 0.1 at % to 30 at %, germanium (Ge) in a range of 60 at % to 99.8 at %, and tin (Sn) in a range of 0.1 at % to 40 at %. A surface roughness (Ra) of the upper surface of the silicon-germanium-tin (SiGeSn) layer is in a range of 0.01 μm to 3 μm.

The present invention provides a semiconductor device, including: a germanium-tin (GeSn) layer or a silicon-germanium-tin (SiGeSn) layer, arranged on an upper surface of a semiconductor substrate as a low-reflection film; and at least one semiconductor element, formed on the semiconductor substrate and the low-reflection film through a semiconductor process.

The semiconductor element is a semiconductor photodetection element, a solar photovoltaic cell element, or a semiconductor light-emitting element.

The present invention provides a substrate with a low-reflection surface film and structure. Compared with the known germanium (Ge) material, the germanium-tin (GeSn) material can make a low-reflection film with better ductility, so that the processing cost is reduced. Then the low-reflection film surface is made rough, so as to reduce the reflectivity of the material surface. The reflectivity is reduced, so that the electronic element formed on the substrate with a low-reflection surface film and structure has a higher absorption for a light source of the same intensity and finds application in the case of near infrared rays, mid infrared rays, and far infrared rays. In this way, the response of a photodetector can be improved, and the PL intensity can also be enhanced. In addition, the substrate containing the germanium-tin (GeSn) material layer may be applied to the semiconductor photodetection element, the solar photovoltaic cell element, or the semiconductor light-emitting element.

DETAILED DESCRIPTION

The embodiments of the present invention will be described in detail below by way of example and with reference to the accompanying drawings. In addition to these detailed descriptions, the present invention may also be widely applied to other embodiments, and any easy substitution, modification and equivalent changes of the described embodiments fall within the scope of the present invention, and the scope of the patent application shall prevail. In the description of this specification, many specific details are provided to provide a thorough understanding of the present invention. However, the present invention may be implemented without some or all of the specific details. In addition, well-known steps or elements have not been described in detail to avoid unnecessary limitations on the present invention. The same or similar components in the figures will be denoted by the same or similar symbols. It should be noted that the accompanying drawings are only schematic, and do not represent the actual size or quantity of elements. Some details may not be completely drawn, so as to keep the accompanying drawings concise.

Figure 1:
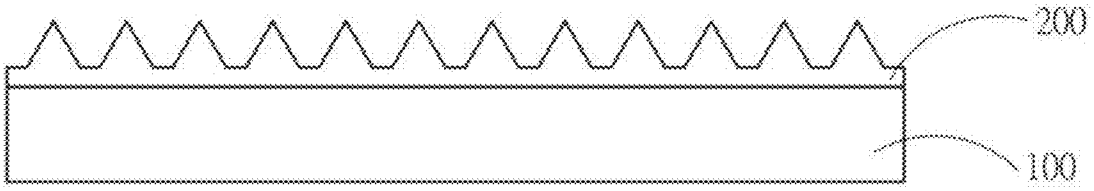
FIG. 1 is a schematic diagram I of a substrate with a low-reflection surface film and structure according to the present invention.
Figure 2:
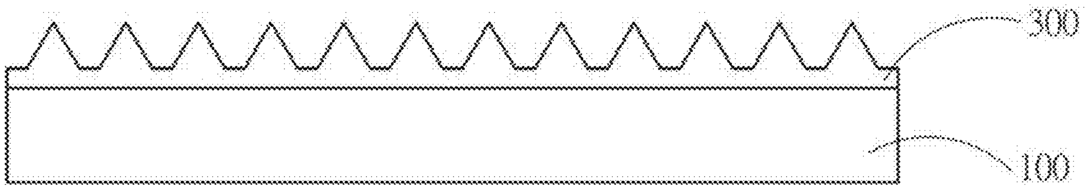
FIG. 2 is a schematic diagram II of a substrate with a low-reflection surface film and structure according to the present invention.

Referring to FIG. 1 and FIG. 2, FIG. 1 and FIG. 2 are schematic diagrams of a substrate with a low-reflection surface film and structure according to the present invention.

The present invention is a substrate with a low-reflection surface film and structure, including a semiconductor substrate 100 and a germanium-tin (GeSn) layer 200 arranged on an upper surface of the semiconductor substrate 100 as a low-reflection film. A thickness of the germanium-tin (GeSn) layer 200 is in a range of 10 nm to 10 μm, and an upper surface of the germanium-tin (GeSn) layer 200 is a rough surface. A surface roughness (Ra) of the upper surface of the germanium-tin (GeSn) layer is in a range of 0.01 μm to 3 μm. A material content of the germanium-tin (GeSn) layer is germanium (Ge) in a range of 60 at % to 99.9 at % and tin (Sn) in a range of 0.1 at % to 40 at %.

In implementation and application, the present invention may include a silicon-germanium-tin (SiGeSn) layer 300 arranged on the upper surface of the semiconductor substrate 100 as a low-reflection film. A thickness of the silicon-germanium-tin (SiGeSn) layer 300 is in a range of 10 nm to 10 μm, and an upper surface of the silicon-germanium-tin (SiGeSn) layer 300 is a rough surface. A surface roughness (Ra) of the upper surface of the silicon-germanium-tin (SiGeSn) layer is in a range of 0.01 μm to 3 μm. A material content of the silicon-germanium-tin (SiGeSn) layer is silicon (Si) in a range of 0.1 at % to 30 at %, germanium (Ge) in a range of 60 at % to 99.8 at %, and tin (Sn) in a range of 0.1 at % to 40 at %.

In some embodiments, the semiconductor substrate 100 is a bulk semiconductor substrate including silicon. Alternatively or additionally, in some embodiments, the bulk semiconductor substrate includes another basic semiconductor, such as germanium; a compound semiconductor such as gallium arsenide, gallium phosphide, indium phosphide, indium arsenide and/or indium antimonide; an alloy semiconductor such as SiGe, GaAsP, AlInAs, AlGaAs, GaInAs, GaInP, and/or GaInAsP; or a combination thereof. In some embodiments, the semiconductor substrate 100 includes an epitaxial layer overlying the bulk semiconductor substrate. In addition, in some embodiments, the semiconductor substrate 100 includes a semiconductor-on-insulator (SOI) substrate of a buried oxide (BOX) layer.

In implementation and application, the germanium-tin (GeSn) layer 200 and the silicon-germanium-tin (SiGeSn) layer 300 may be selectively formed on a semiconductor surface of the substrate. This is realized by the following steps: positioning the semiconductor substrate 100 in a processing chamber; flowing a germanium precursor, a tin precursor, and a dopant together into the processing chamber; epitaxially growing the germanium tin (GeSn) layer 200 and the silicon-germanium-tin (SiGeSn) layer 300 until a desired layer thickness is reached; and repeating the epitaxial growth until the germanium-tin (GeSn) layer 200 and the silicon-germanium-tin (SiGeSn) layer 300 with the desired overall thickness are selectively grown on a surface of the semiconductor substrate 100.

In implementation and application, the upper surfaces of the germanium-tin (GeSn) layer 200 and the silicon-germanium-tin (SiGeSn) layer 300 are rough surfaces. A conventional rough surface manufactured by wet etching may be used as an anti-reflection surface, for example, the conventional rough surface manufactured by KOH wet etching or plasma dry etching. A micro pyramid generated accordingly has a width in a range of 0.005 μm to 15 μm and a height in a range of 0.002 μm to 8 μm. In implementation, the broadband anti-reflection silicon surface may also be manufactured by laser micro/nano processing. Laser direct writing is used for creating a microstructure on the surfaces of the germanium-tin (GeSn) layer 200 and the silicon-germanium-tin (SiGeSn) layer 300.

Figure 3:
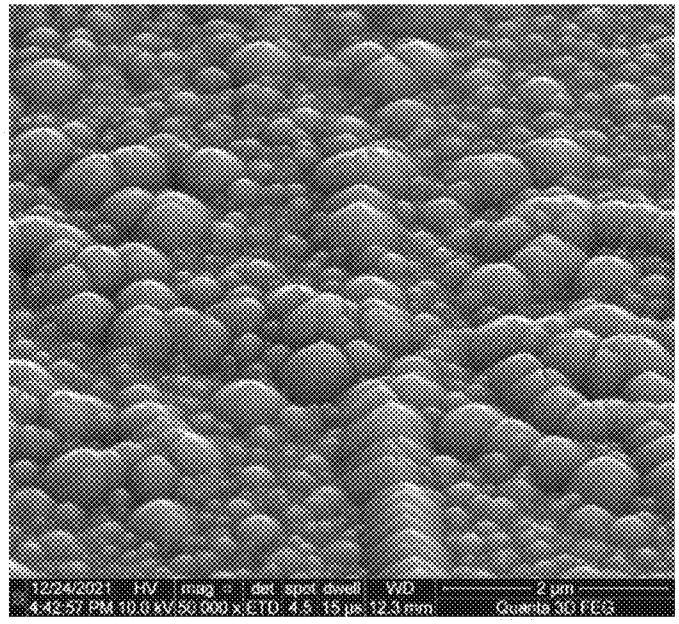
FIG. 3 is an SEM image of surface-roughened germanium (Black Ge).
Figure 5:
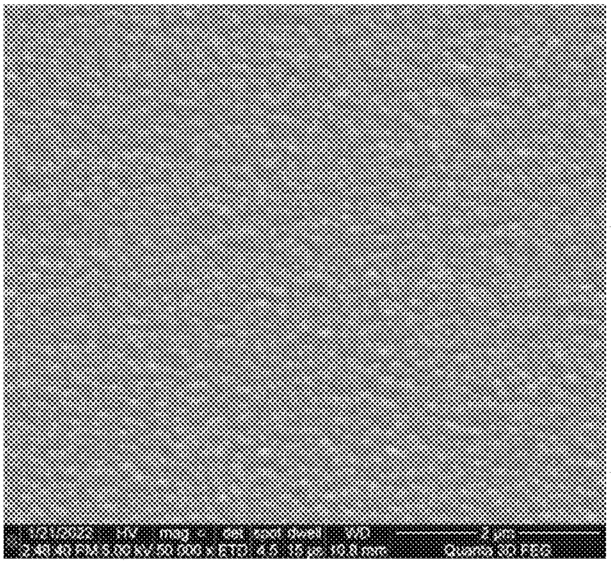
FIG. 5 is an SEM image of surface-roughened germanium-tin (Black GeSn) according to the present invention.

In the present invention, compared with the known only use of the germanium (Ge) material, the tin (Sn) material can be used to obtain a low-reflection film with better ductility. By using the characteristics of the same family of silicon (Si), germanium (Ge), and tin (Sn), silicon (Si), germanium (Ge), and tin (Sn) are well mixed as the low-reflection film on the surface of the semiconductor substrate 100, and the low-reflection film containing tin (Sn) can obtain a more uniformly roughened surface as the anti-reflection surface. An SEM image of surface-roughened germanium (Black Ge) is shown in FIG. 3. An SEM image of surface-roughened germanium-tin (Black GeSn) is shown in FIG. 5. A more uniformly roughened surface is shown in FIG. 5.

Figure 4:
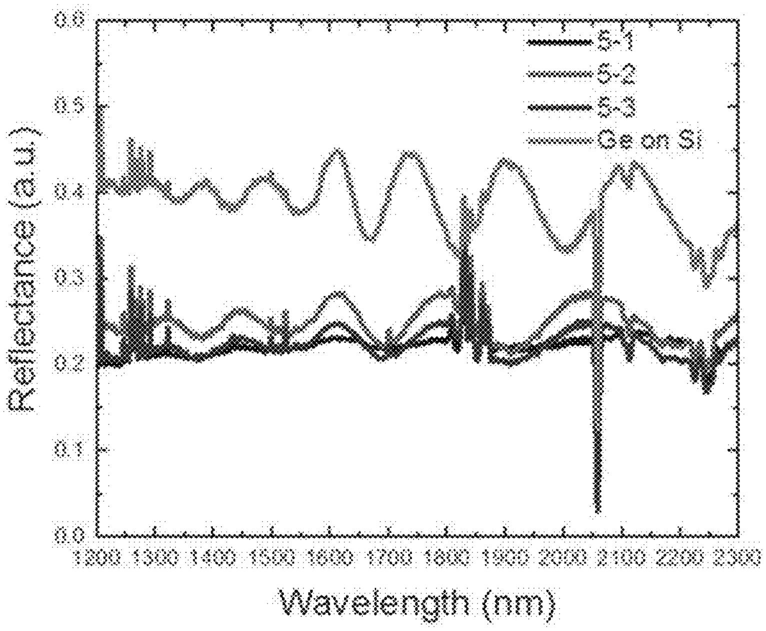
FIG. 4 is a schematic diagram of reflectances of FIG. 3.

In the known art, the SEM image of surface-roughened germanium (Black Ge) is shown in FIG. 3, and reflectances of a germanium (Ge on Si) film and surface-roughened germanium (Black Ge) arranged on a Si substrate are shown in FIGS. 4 (5-1, 5-2, and 5-3 in FIG. 4). It may also be seen that the reflectance of the surface-roughened germanium (Black Ge) is greatly reduced.

Figure 6:
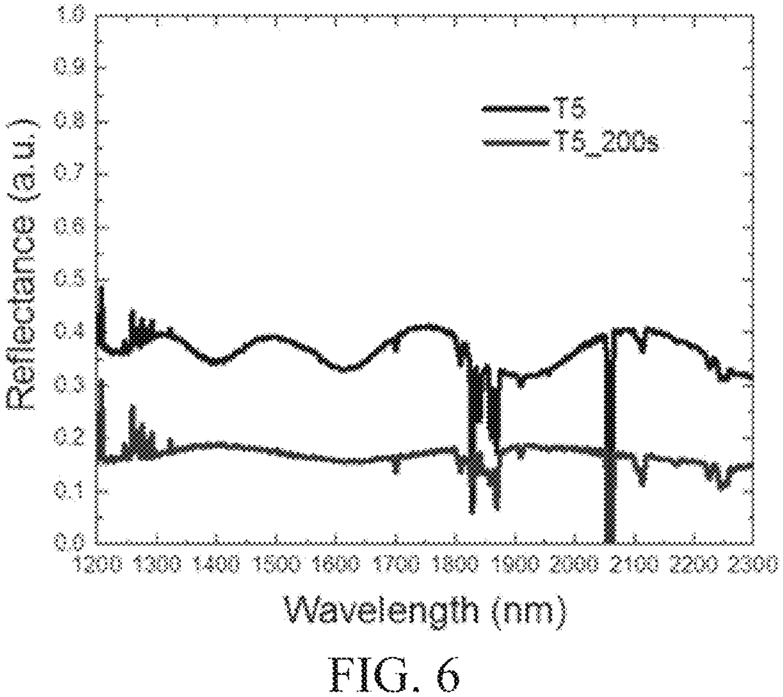
FIG. 6 is a schematic diagram of reflectances of FIG. 5.

In the application of the art in the present invention, the SEM image of the surface-roughened germanium-tin (Black GeSn) is shown in FIG. 5, and reflectances of a germanium-tin (GeSn) film (T5) and surface-roughened germanium-tin (Black GeSn) (T5_200S) arranged on the Si substrate are shown in FIG. 6. It can be seen that the reflectivity of etched germanium tin (T5_200s) for a light wavelength in a range of 1200 nm to 2300 nm is greatly reduced compared with the original data (T5). The average reflectivity of the surfaces of the germanium-tin (GeSn) layer 200 and the silicon-germanium-tin (SiGeSn) layer 300 decreases from about 40% to about 15% at the light wavelength of 1200 nm to 2300 nm. Compared with a flat surface, the etched surfaces of the germanium-tin (GeSn) layer 200 and the silicon-germanium-tin (SiGeSn) layer 300 have many micro-cones. The micro-cones redirect incident light into the semiconductor substrate 100. For these surfaces, the incident light is reflected from one micro-cone to the other. This multiple internal reflection process can greatly increase an optical length of the incident light. Therefore, the germanium-tin (GeSn) layer 200 and the silicon-germanium-tin (SiGeSn) layer 300 substrate have a significantly increased opportunity to absorb light.

Figure 7:
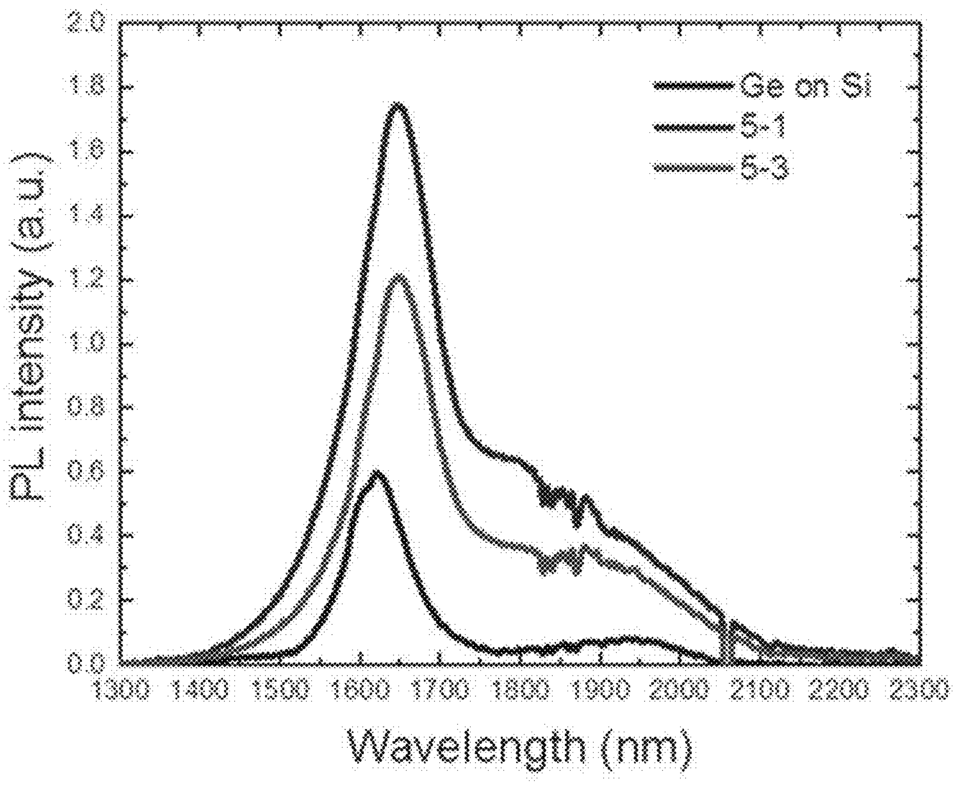
FIG. 7 is a schematic diagram of PL intensities of FIG. 3.

Through the same principle, the SEM image of surface-roughened germanium (Black Ge) is shown in FIG. 3, and photoluminescence (PL) intensities of a germanium (Ge on Si) film and surface-roughened germanium (Black Ge) arranged on a Si substrate is shown in FIGS. 7 (5-1 and 5-3 in FIG. 7). It may also be seen that the PL intensity of the surface-roughened germanium (Black Ge) is enhanced. It may be inferred that the rough surfaces of the germanium-tin (GeSn) layer 200 and the silicon-germanium-tin (SiGeSn) layer 300 are low-reflection surface films and also have the high PL intensity.

In the present invention, the germanium-tin (GeSn) layer 200 or the silicon-germanium-tin (SiGeSn) layer 300 is arranged on the upper surface of the semiconductor substrate 100 as a low-reflection film, and the surface of the germanium-tin (GeSn) layer 200 or the silicon-germanium-tin (SiGeSn) layer 300 becomes rougher. In this way, the reflectivity of the material surface can be reduced. The material with the reduced reflectivity has a higher absorption for a light source of the same intensity, the response of a photodetector can be improved, and the PL intensity can also be enhanced. Therefore, the substrate in the present invention can be applied to a semiconductor device with the reflectivity required to be reduced, light absorption required to be enhanced, and light emission required to be enhanced.

In implementation and application, the semiconductor device of the present invention is applied to the substrate including the germanium-tin (GeSn) layer 200 or the silicon-germanium-tin (SiGeSn) layer 300 arranged on the upper surface of the semiconductor substrate 100 as a low-reflection film, and at least one semiconductor element is formed on the semiconductor substrate 100 and the low-reflection film through a semiconductor process. The semiconductor element is a semiconductor photodetection element, a solar photovoltaic cell element, or a semiconductor light-emitting element.

The present invention provides a substrate with a low-reflection surface film and structure. Compared with the known germanium (Ge) material, the germanium-tin (GeSn) material can make a low-reflection film with better ductility, so that the processing cost is reduced. Then the low-reflection film surface is made rough, so as to reduce the reflectivity of the material surface. The reflectivity is reduced, so that the electronic element formed on the substrate with a low-reflection surface film and structure has a higher absorption for a light source of the same intensity and finds application in the case of near infrared rays, mid infrared rays, and far infrared rays. In this way, the response of a photodetector can be improved, and the photoluminescence intensity can also be enhanced. In addition, the substrate containing the germanium-tin (GeSn) material layer may be applied to the semiconductor photodetection element, the solar photovoltaic cell element, or the semiconductor light-emitting element.

The above embodiments merely exemplify the principles, features, and effects of the present invention, but are not intended to limit the implementation scope of the present invention. A person skilled in the art can modify or change the above embodiments without departing from the spirit and scope of the present invention. Any equivalent change or modification made using the contents disclosed by the present invention shall fall within the scope of the claims below.

What is claimed is:

1. A semiconductor device, comprising:

a substrate with a low-reflection surface film and structure, comprising:

a semiconductor substrate; and a germanium-tin (GeSn) layer, arranged on an upper surface of the semiconductor substrate as a low-reflection film, wherein a thickness of the germanium-tin (GeSn) layer is in a range of 10 nm to 10 μm, and an upper surface of the germanium-tin (GeSn) layer is a rough surface; and at least one semiconductor element, formed on the semiconductor substrate and the low-reflection film through a semiconductor process;

wherein the semiconductor element is a semiconductor light-emitting element.

2. The semiconductor device according to claim 1, wherein a material content of the germanium-tin (GeSn) layer is germanium (Ge) in a range of 60 at % to 99.9 at % and tin (Sn) in a range of 0.1 at % to 40 at %.

3. The semiconductor device according to claim 1, wherein a surface roughness (Ra) of the upper surface of the germanium-tin (GeSn) layer is in a range of 0.01 μm to 3 μm.

* * * * *